United States Patent
Qian et al.

(10) Patent No.: US 9,378,834 B2
(45) Date of Patent: Jun. 28, 2016

(54) BITLINE REGULATOR FOR HIGH SPEED FLASH MEMORY SYSTEM

(71) Applicant: Silicon Storage Technology, Inc., San Jose, CA (US)

(72) Inventors: Xiaozhou Qian, Shanghai (CN); Yao Zhou, Shanghai (CN); Bin Sheng, Shanghai (CN); Jiaxu Peng, Shanghai (CN); Yaohua Zhu, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/486,673

(22) Filed: Sep. 15, 2014

(65) Prior Publication Data

US 2016/0027519 A1 Jan. 28, 2016

(30) Foreign Application Priority Data

Jul. 22, 2014 (CN) .......................... 2014 1 0429526

(51) Int. Cl.

| | |
|---|---|
| *G11C 16/06* | (2006.01) |
| *G11C 16/24* | (2006.01) |
| *G11C 29/02* | (2006.01) |
| *G11C 29/28* | (2006.01) |
| G11C 16/28 | (2006.01) |
| G11C 29/12 | (2006.01) |

(52) U.S. Cl.
CPC .............. *G11C 16/24* (2013.01); *G11C 29/021* (2013.01); *G11C 29/28* (2013.01); *G11C 16/28* (2013.01); *G11C 2029/1204* (2013.01)

(58) Field of Classification Search
CPC ............... G11C 16/28; G11C 11/5642; G11C 2211/5634
USPC ................ 365/185.2, 185.18, 185.23, 185.25
IPC ...................... G11C 16/28, 11/5642, 2211/5634
See application file for complete search history.

(56) References Cited

U.S. PATENT DOCUMENTS

| | | | |
|---|---|---|---|
| 5,532,964 A * | 7/1996 | Cernea .................... | G11C 16/10 365/185.18 |
| 7,630,250 B2 * | 12/2009 | Binboga ............ | G11C 16/0475 356/185.03 |
| 2009/0033306 A1 | 2/2009 | Tanzawa | |
| 2009/0086542 A1 | 4/2009 | Lee | |
| 2009/0097312 A1 | 4/2009 | Binboga | |
| 2009/0103365 A1 | 4/2009 | Roohparvar | |
| 2009/0147585 A1 | 6/2009 | Ch Ng | |
| 2010/0128551 A1 | 5/2010 | Tanzawa | |
| 2011/0148500 A1 | 6/2011 | Huang | |
| 2012/0230071 A1 * | 9/2012 | Kaneda ................. | H02M 3/073 363/59 |
| 2012/0230081 A1 * | 9/2012 | Close ...................... | G11C 5/147 365/148 |
| 2014/0043907 A1 | 2/2014 | Fujimura | |

\* cited by examiner

*Primary Examiner* — Connie Yoha

(74) *Attorney, Agent, or Firm* — DLA Piper LLP (US)

(57) ABSTRACT

A bitline regulator for use in a high speed flash memory system is disclosed. The bitline regulator is responsive to a set of trim bits that are generated by comparing the bias voltage of a bitline to a reference voltage.

19 Claims, 4 Drawing Sheets

BITLINE REGULATOR FOR HIGH SPEED FLASH MEMORY SYSTEM

PRIORITY CLAIM

The present application claims priority under 35 U.S.C. Section 119 to Patent Application 201410429526.1, titled "Bitline Regulator for High Speed Flash Memory System" and filed in the People's Republic of China on Jul. 22, 2014, which is incorporated by reference herein.

TECHNICAL FIELD

A bitline regulator for use in a high speed flash memory system is disclosed.

BACKGROUND OF THE INVENTION

Flash memory systems are well-known. Flash memory systems typically comprise one or more arrays of flash memory cells. The cells are organized into rows and columns within the array. Each row is activated by a word line, and each column is activated by a bitline. Thus, a particular flash memory cell is accessed for either read or write operations by asserting a specific word line and a specific bitline.

In some prior art systems, during read operations, the bitline will be precharged by a bitline regulator to a bias voltage accurately in a very short period. This increases the speed and accuracy of the system.

As flash memory systems have become faster, the prior art bitline regulators have become limiting factors in how fast the system can run. For example, if a flash memory system operates at 100 MHz or faster, the bitline regulator must precharge the bitline in 1 ns or less. Prior art bitline regulators are unable to operate at this speed.

Some examples of prior art bitline regulators include those that utilize a Vt clamp, an operational amplifier, or an NMOS follower. These prior art systems are unable to operate accurately at higher speeds.

What is needed is an improved bitline regulator design that can operate at high speeds. What is further needed is a bitline regulator that can be automatically trimmed during operation of the memory system as operating conditions change and processes change.

SUMMARY OF THE INVENTION

An improved bitline regulator for use in flash memory systems is disclosed. The bitline regulator can be automatically trimmed so that it the bitline bias voltage is adjusted as operating conditions change.

FIG, 2 depicts an embodiment of a bitline regulator.

Figure 3:
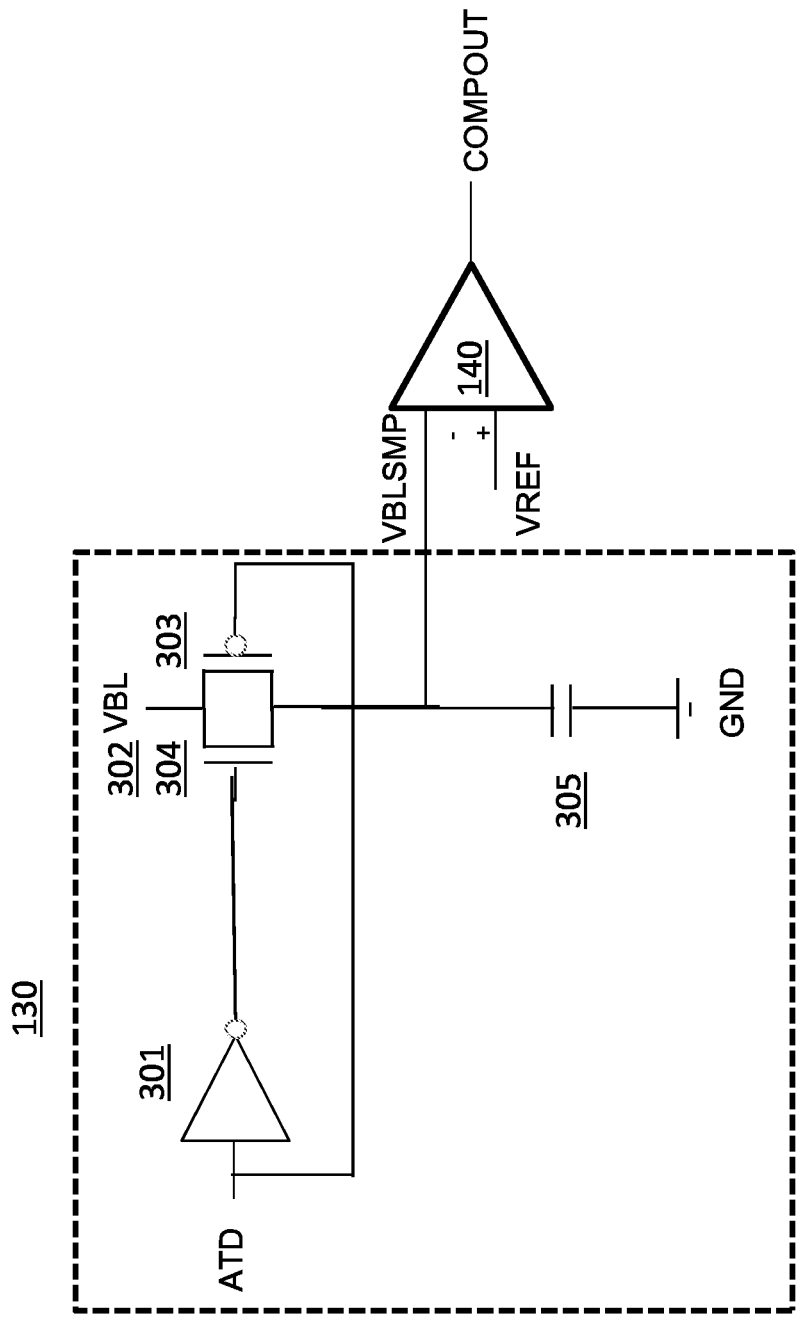

FIG. 3 depicts an embodiment of a sample and hold circuit and a comparator.

Figure 4:
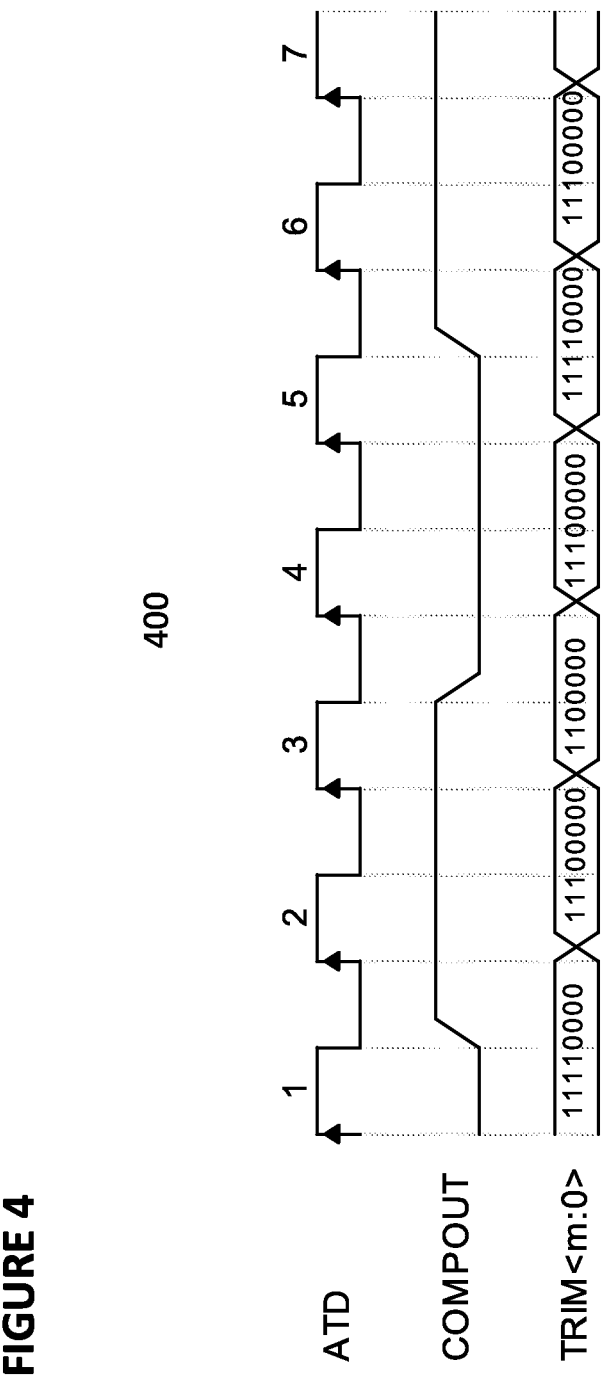

FIG. 4 depicts an exemplary timing diagram showing the trimming of a bitline regulator.

DETAILED DESCRIPTION OF THE PREFERRED EMBODIMENTS

Figure 1:
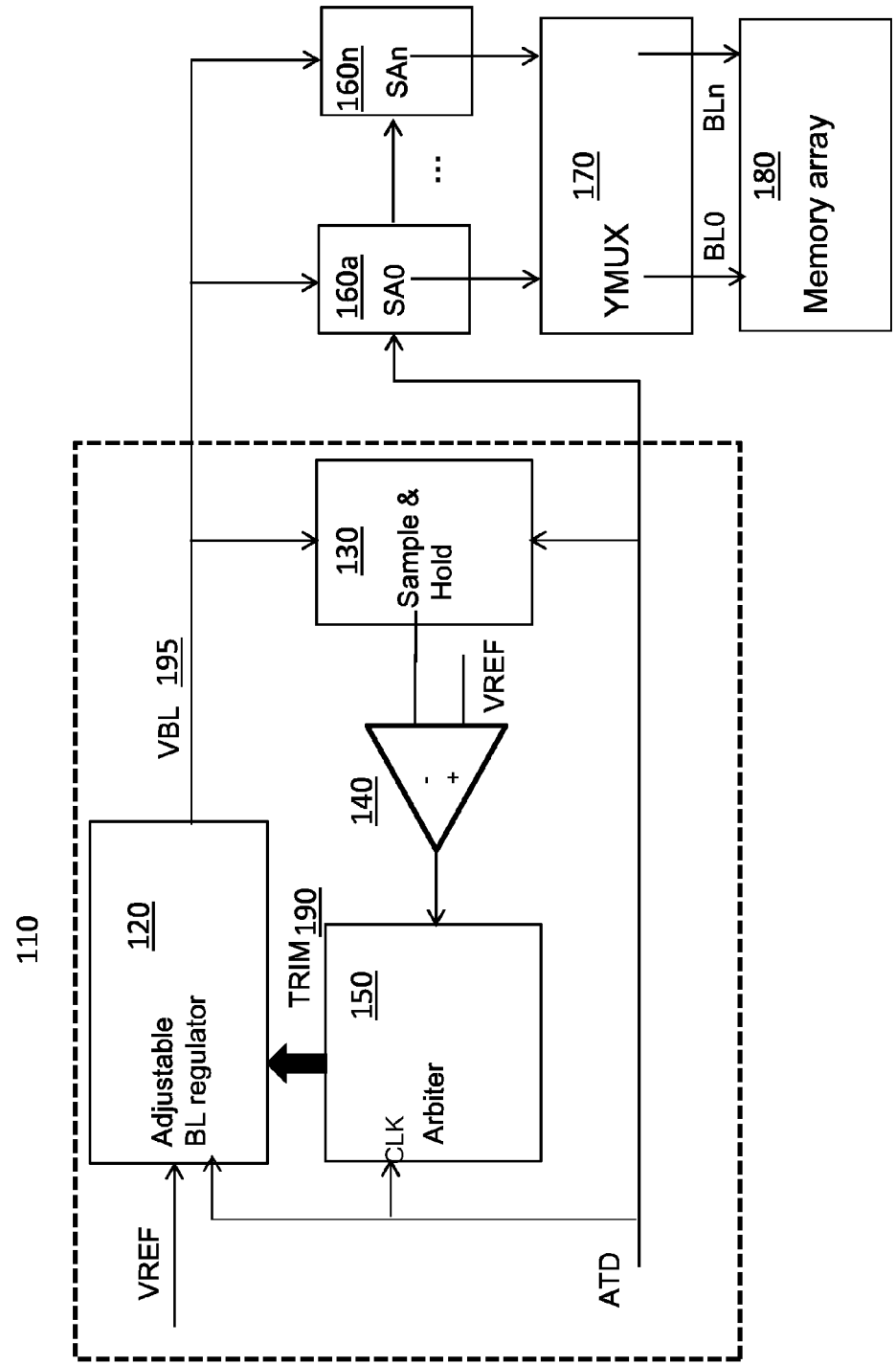
FIG. 1 depicts an embodiment of a flash memory system comprising a bitline regulator.

With reference to FIG. 1, an embodiment of flash memory system 100 is depicted. Flash memory system 100 comprises flash memory array 180, column multiplexor 170, and sense amplifiers 160*a* . . . 160*n* (where n is an integer) as is known in the prior art. Each of the sense amplifiers 160*a* . . . 160*n* is used to read the voltage stored in a memory cell in a column corresponding to the bitline during a read operation.

Flash memory system 100 also comprises trimmable bitline regulator system 110, which comprises bitline regulator 120, sample and hold circuit 130, comparator 140, and arbiter 150.

Bitline regulator 120 receives a reference voltage, VREF, and outputs a precharged bit line 195, labeled VBL. An exemplary value for VREF is 1.0 volts. Precharged bitline 195 is provided to each of the sense amplifiers 160*a* . . . 160*n* and precharges the bit lines used during a read operation through sense amplifiers.

Sample and hold circuit 130 receives precharged bitline 195 as well as the control signal /ATD. Sample and hold circuit 130 will sample the precharged bitline 195 on an edge of control signal /ATD and will output the result to comparator 140.

Comparator 140 also receives the reference voltage, VREF, and outputs a signal that indicates if VREF is greater than or less than the signal received from sample and hold circuit 130.

Arbiter 150 receives the output of comparator 140. If VREF is greater than the output of sample and hold circuit 130, arbiter will adjust trim bits 190 to cause bitline regulator to increase the voltage of precharged bitline 195. If VREF is equal to or less than the output of sample and hold circuit 130, arbiter will adjust trim bits 190 to cause bitline regulator to decrease the voltage of precharged bitline 195.

Figure 2:
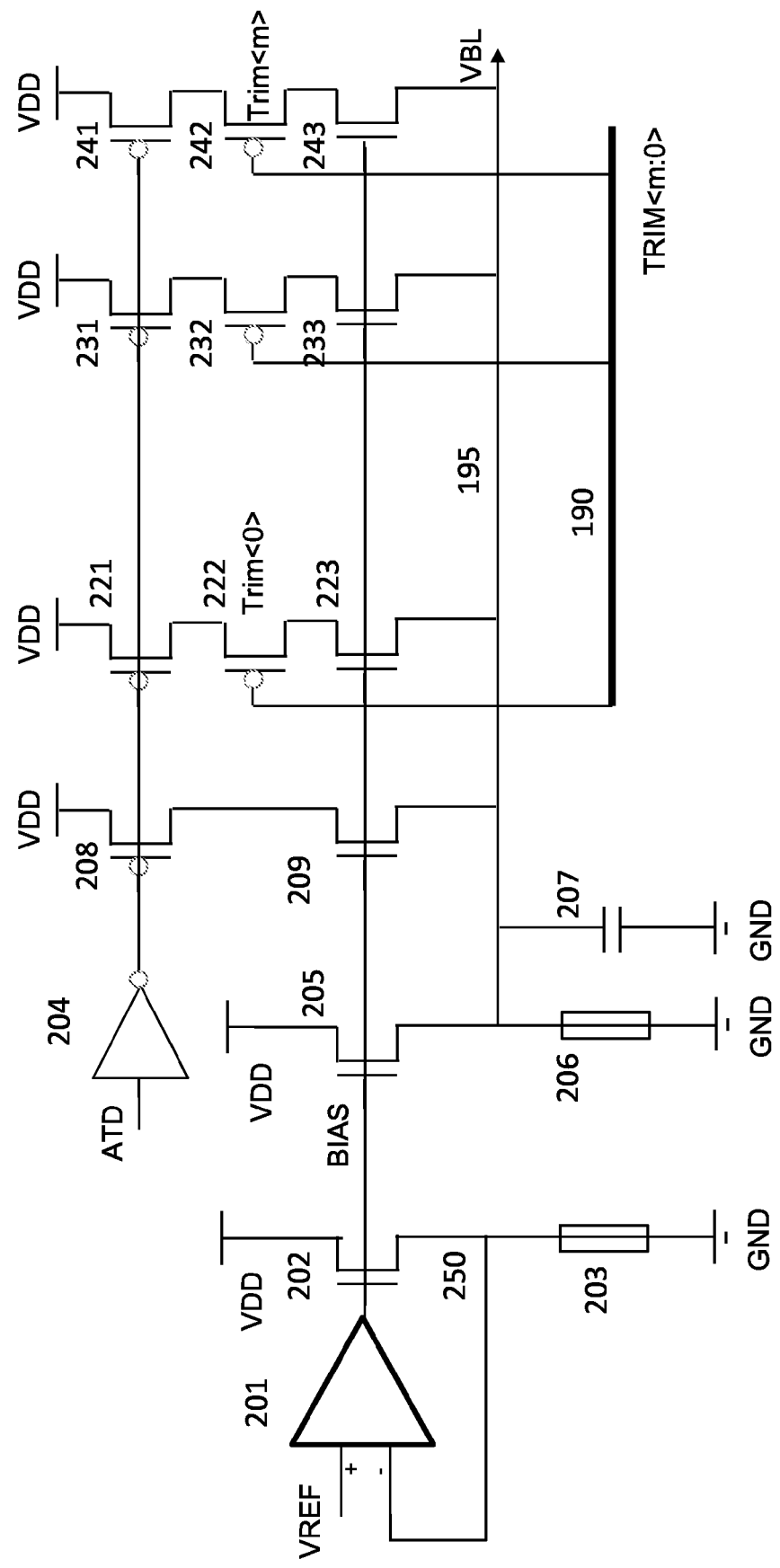

With reference to FIG. 2, additional detail is depicted for an embodiment of bitline regulator 120. Bitline regulator 120 comprises amplifier 201. Amplifier 201 receives VREF on its positive input and outputs the voltage BIAS, where BIAS=VREF+the threshold voltage of NMOS transistor 202. The negative input of amplifier 201 is node 250, which will equal VREF. The output, VBL, will be equal to VREF−the threshold voltage of NMOS transistor 205, which if NMOS transistor 205 and NMOS transistor 202 are well-matched, will be around VREF. The control signal ATD is received by inverter 204 to produce /ATD. When ATD is high, /ATD will be low, and as a result, PMOS transistors 208, 221, 231 . . . 241 will be turned on. When ATD is low, /ATD will be high, and as a result, PMOS transistors 208, 221, 231 . . . 241 will be turned off.

When ATD is high then VBL 195 will receive current from the boost circuit comprising NMOS transistor 205 and the boost circuit comprising PMOS transistor 209 and NMOS transistor 209, which will supply a minimum current loading on VBL. This boost circuit will increase the output strength of bitline regulator 120 at VBL, which will prevent, for example, a voltage droop that might otherwise occur as the load changes. Thus, VBL will be held at a more constant level as the result of the automatic trimming process and will be able to withstand a wider range of load.

The values of trim bits 190, which are set by arbiter 150, also can add connect additional boost circuits to VBL 195, which will further increase the output strength of bitline regulator 120. Here, trim bits 190 comprise m+1 bits (where m is an integer, and generally will be equal to n, as there are n+1 sense amplifiers and n+1 columns in the array). Each of the trim bits 190 is connected to the gate of a PMOS transistor, here shown as PMOS transistor 222, 232 . . . 242. Although three boost circuits are shown for receiving trim bits 190 (one boost circuit comprising PMOS transistors 221 and 222 and NMOS transistor 223; another boost circuit comprising PMOS transistors 231 and 231 and NMOS transistor 233; and another boost circuit comprising PMOS transistors 241, 242 and NMOS transistor 243), it is to be understood that there are m+1 boost circuits, each corresponding to one of trim bit 190 and each identical to any of the three boost circuits shown.

Thus, the bias voltage held by VBL 195 can be held constant by adjusting the values of trim bits 190 as conditions change. This avoids a droop in voltage.

With reference to FIG. 3, additional detail is shown for an embodiment of sample and hold circuit 130 and comparator 140. Sample and hold circuit 130 comprises inverter 301, switch 302 (which comprises PMOS transistor 303 and NMOS transistor 304) and capacitor 305. The control signal ATD, when low, turns on switch 302, which in turn allows VBL 195 to be fed into comparator 140. Comparator 140 then compares the voltages of the reference voltage VREF and the sampled voltage from VBL 195, to generate an output COMPOUT, which is then provided to arbiter 150.

Arbiter 150 optionally comprises a controller. In the alternative, arbiter 150 can comprise discrete logic.

With reference to FIG. 4, exemplary timing diagram 400 is shown. The control signal ATD varies over time as shown. The values for trim bits 190 and the voltage of VBL 195 can be reassessed at every ATD pulse.

The output COMPOUT from comparator 140 is shown, and in this example, changes over time, which represents changes in the voltage of VBL 195 (perhaps due to changes in temperature, changes in load, etc.). Exemplary values for trim bits 190 are shown. For example, when the value of COMPOUT changes at the end of time period 1, an adjustment can be made to trim bits 190 from 11110000 to 11100000 and then to 11000000, representing a change that will be made to VBL 195 by bitline regulator 120. When the value of COMPOUT changes again at the end of period 3, an adjustment is made to trim bits 190 from 11000000 to 11100000 and then to 11110000.

Thus, changes can be made to VBL 195 in real time by adjusting trim bits 195.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A memory system, comprising:
    an array of memory cells organized into rows and columns, wherein each column of memory cells is coupled to a bit line; and
    a bitline regulator for applying a bias voltage to each bit line, the bitline regulator comprising:
        a first circuit for outputting a plurality of trim bits; and
        a second circuit adjusting the bias voltage in response to the plurality of trim bits; wherein the first circuit comprises:
            a sample and hold circuit for generating a sampled voltage based on the bias voltage;
            a comparator for comparing the sampled voltage to a reference voltage and generating an output; and
            an arbiter for receiving the output from the comparator and generating the trim bits.

2. The memory system of claim 1, wherein the first circuit generates the trim bits based upon a comparison of the bias voltage to a reference voltage.

3. The memory system of claim 1, wherein the second circuit comprises:
    a boost circuit for adjusting the output strength in response to one of the trim bits.

4. The memory system of claim 3, wherein the second circuit comprises:
    a plurality of boost circuits, each responsive to a trim bit, for adjusting the output strength.

5. The memory system of claim 3, wherein the second circuit further comprises:
    a control signal for enabling the boost circuit.

6. The memory system of claim 4, wherein the second circuit further comprises:
    a control signal for enabling the plurality of boost circuits.

7. The memory system of claim 1, wherein the memory cells comprise flash memory cells.

8. A memory system, comprising:
    an array of memory cells organized into rows and columns, wherein each column of memory cells is coupled to a bit line; and
    a bitline regulator for applying a bias voltage to each bit line, the bitline regulator comprising:
        a sample and hold circuit for generating a sampled voltage based on the bias voltage;
        a comparator for comparing the sampled voltage to a reference voltage and generating an output;
        an arbiter for receiving the output from the comparator and generating trim bits; and
        a boost circuit for adjusting the output strength in response to one or more of the trim bits.

9. The memory system of claim 8, wherein the memory cells comprise flash memory cells.

10. The memory system of claim 8, wherein the trim bits comprise eight bits.

11. The memory system of claim 8, wherein the reference voltage is 1.0 volts.

12. The memory system of claim 8, wherein the arbiter comprises a controller.

13. The memory system of claim 8, wherein the arbiter comprises discrete logic.

14. A method of adjusting a bias voltage of a bitline in a memory system, comprising:
    sampling a voltage of the bitline to generate a sampled voltage;
    comparing the sampled voltage to a reference voltage to generate an output;
    generating, from within the memory system, a plurality of trim bits in response to the output; and
    changing the bias voltage in response to the plurality of trim bits.

15. The method of claim 14, wherein the changing step is performed by a bitline regulator.

16. The method of claim 14, wherein the changing step comprises coupling one or more boost circuits to the bitline.

17. The method of claim 14, wherein the changing step is enabled by a control signal.

18. The method of claim 14, wherein the reference voltage is 1.0 volts.

19. The method of claim 14, further comprising using the bitline to read a memory cell.

\* \* \* \* \*